United States Patent [19]

Oka et al.

[11] Patent Number: 5,327,372
[45] Date of Patent: Jul. 5, 1994

[54] SEMICONDUCTOR MEMORY DEVICE

[75] Inventors: Akihisa Oka; Seiji Yamaguchi, both of Osaka, Japan

[73] Assignee: Matsushita Electric Industrial Co., Ltd., Osaka, Japan

[21] Appl. No.: 4,273

[22] Filed: Jan. 14, 1993

[30] Foreign Application Priority Data

Jan. 17, 1992 [JP] Japan .................. 4-006273
Jan. 27, 1992 [JP] Japan .................. 4-011691

[51] Int. Cl.⁵ ............................ G11C 15/00
[52] U.S. Cl. ..................... 315/49; 365/203; 365/189.05; 365/189.07
[58] Field of Search .......... 365/49, 238.5, 189.07, 365/189.05, 230.08, 203

[56] References Cited

U.S. PATENT DOCUMENTS

| | | | |
|---|---|---|---|
| 4,377,855 | 3/1983 | Lavi | 365/49 |
| 4,453,230 | 6/1984 | Mizoguchi et al. | 364/900 |
| 4,646,271 | 2/1987 | Uchiyama et al. | 365/49 |
| 4,894,799 | 1/1990 | Hanawa et al. | 365/49 |

OTHER PUBLICATIONS

J. Miyaka et al., "A 40 MIPS (Peak) 64-bit Microprocessor with One-Clock Physical Cache Load/Store", ISSCC Digest of Technical Papers, pp. 42–43, Feb. 1990.

*Primary Examiner*—Joseph A. Popek
*Attorney, Agent, or Firm*—Willian Brinks Hofer Gilson & Lione

[57] ABSTRACT

A CAM cell array for storing a logical address is divided into first to third CAM sections. A first partition switch circuit intervenes between a zeroth piece of sense line connected to a sense circuit and a first piece of sense line for the first CAM section. The sense circuit is a circuit for selecting a RAM cell array in which a physical address to be read out is stored. A second partition switch circuit intervenes between the first piece of sense line and a second piece of sense line for the second CAM section. A third partition switch circuit intervenes between the second piece of sense line and a third piece of sense line for the third CAM section. By controlling switching operation of respective partition switch circuits according to page size, optimum length of the sense line is utilized, thus achieving a high-speed address translation.

8 Claims, 9 Drawing Sheets

SEMICONDUCTOR MEMORY DEVICE

BACKGROUND OF THE INVENTION

This invention relates to a semiconductor memory device having associative memory cell arrays, and particularly relates to a semiconductor memory device suitable for high-speed address translation.

A virtual storage has been known as one of memory management configurations in a 32-bit microprocessor and the like. In the virtual storage, a logical address space (virtual address space) is required to correspond to a physical address space (real address space). For making the correspondence, a paging method is chiefly adopted. According to the paging method, the logical address space and the physical address space are respectively divided into set sized pages to determine the correspondence between the page number of the logical address space and that of the physical address space. For instance, in case where a logical address space to be accessed with a 32-bit logical address (VA[31:0]) is divided into 4 KB (kilobyte) sized pages, the upper 20 bits (VA[31:12]) of the logical address are dealt with as an index indicating the page number of the logical address space, and the lower 12 bits (VA[11:0]) are regarded as a relative address in the page, i.e., a displacement. The page number (VA[31:12]) of the logical address space is translated into the page number (index) of the physical address space by an address translating device, commonly called a TLB (tranlation lookaside buffer). The physical address space are accessed by a combination of the page number of the physical address space and the displacement (VA[11:0]).

An associative memory, i.e., a CAM (content addressable memory) is incorporated in a TLB. In the TLB keys are searched in parallel, which leads to a high-spaced performance of the correspondence of page numbers. A basic structure of the conventional TLB of this type is disclosed in "A 40 MIPS (PEAK) 64-bit Microprocessor with One-Clock physical Cache Load/Store", ISSCC DIGEST OF TECHNICAL PAPERS, pp. 42-44, February 1990 by Miyake, J. et al., and the like. The TLB has a plurality of entries composed of a combination of CAM cell arrays and RAM (random access memory) cell arrays. Each CAM cell array has bit lines for supplying a logical address (index part only), one word line (CAM word line) for selecting a write entry, and one sense line for comparing operation (conformity detection). Each RAM cell array has bit lines composing a single port for read/write of a physical address (index part only), and one word line (RAM word line) for selecting read/write entries. The word line of each RAM cell array is asserted by a logical sum of a signal on the word line of the corresponding CAM cell array and a signal on the sense line thereof.

In the conventional TLB, a fixed bit length of the CAM cell array in each entry is available. While, in the paging method, the page size is desirable to be changeable. There is a case where the page size is desired to be changed according to the scale of a program. Especially, when a plurality of tasks are processed in parallel in a workstation, page sizes occasionally differ with tasks. In such a case, conventionally, it is necessary to write dummy bits into the CAM cell arrays by a software.

In a detail, in case where one of four page sizes, 4 KB, 256 KB, 16 MB (megabyte) and 4 GB (gigabyte) is to be selected, the TLB must include CAM cell arrays for the longest index to specifying a page with a minimum page size. When the 256 KB or 16 MB page size is selected, the index of a 14-bit or 8-bit length (VA[31:18] or VA[31:24] has only to be dealt with, while the lower 18 bits or the lower 24 bits (VA[17:0] or V[23:0]) of the 32-bit logical address (VA[31:01] ) are regarded as a displacement. With the 4 GB page size, the 32-bit logical address (VA[31:0] ) is entirely regarded as a displacement, and the page number of the logical address space and that of the physical address space are in a correspondence of one to one. On the other hand, with the minimum page size, 4 KB, it is required to deal with the longest index (VA[31:12]) of 20 bits. Therefore, the TLB should have CAM cell arrays each having 20 CAM cells.

In this case, when the page size is set to 4 KB, all CAM cells in each CAM cell array are effectively used. Each CAM cell array stores 20-bit index (VA[31:12]) at assertion of the CAM word line, and asserts the sense line according to a result of comparing the stored index with a 20-bit index newly given on the bit lines. As a result, a RAM cell array belonging to the same entry as a hit CAM cell array is selected, thus obtaining a desired physical address. However, when the page size is set to 256 KB, for example, the number of effectively used CAM cells are only 14 out of 20, and the dummy bits each having set value must be written into the remaining six CAM cells, because the same comparing operation is carried out in the six CAM cells as in the other CAM cells.

In the above conventional TLB, the RAM word line is asserted by a logical sum of the CAM word line and the sense line in each entry, thus a sense circuit for driving the RAM word line according to the state of the sense line is complicated. This hinders from a high-speed operation of the TLB.

Further, since the above conventional TLB is provided with a single read/write port for a physical address in each of the RAM cell arrays, it is liable to cause a malfunction of an unexpected write into the RAM cell array. The logical address (index part only) is given onto the bit lines of the CAM cell arrays at the comparing operation. When two or more CAM cell arrays store respectively logical addresses which are approximate to each other, with difference in signal delay time of each bit line, a plurality of sense lines are asserted concurrently, with a result that a plurality of the RAM cell arrays are selected. Hence, the physical address read out from a certain selected RAM cell array is written into another RAM cell array which is selected at the same time. Thus, a correct physical address in the latter RAM cell array is mis-rewritten.

Moreover, in the above conventional TLB, since the available bit length of the CAM cell array in each entry is fixed, even when one of the page sizes other than minimum page size (256 KB, 16 MB, 4 GB in the above example) is applied, the comparing operation is carried out in all CAM cells prepared for the minimum page size. Thus, the wiring of the sense line of each CAM cell array is occasionally long unnecessarily and each sense line has large wiring capacitance. This prevents a high-speed comparing operation in the CAM cell arrays, and in its turn, prevents a high-speed operation of the TLB. In addition, an electric power is unnecessarily dissipated for precharging the sense line.

SUMMARY OF THE INVENTION

This invention has its object of providing a semiconductor memory device which has CAM cell arrays and RAM cell arrays, and which can perform a high-speed, accurate operation with less power dissipation when applied to address translation and the like.

In this invention, for the high-spaced, accurate operation, a read-out port and a write-in port for the RAM cell arrays are separated from each other. A first word line for writing information into one of the RAM cell arrays and a second word line for reading the information from the RAM cell array are separated from each other, the first word line is used in common with a word line for writing information into one of the CAM cell arrays, and the second word line is asserted by the sense circuit solely based on a sense line of the CAM cell array. The sense circuit can be simplified in its construction and performs a high-speed operation to realize a high-speed read-out of the RAM cell array. An unexpected write-in to the RAM cell arrays is prevented without failure.

In this invention, for a high-speed comparing operation in the CAM cell arrays, each CAM cell array is divided into plural CAM sections, each sense line is divided into plural pieces, and unnecessary pieces are cut off by a plurality of partition switch circuits so as to use only necessary CAM sections out of the plural CAM sections. The sense line can be reduced in the wiring length to be used and in wiring capacitance.

Array control signals for controlling opening and closing of the partition switch circuits are preferably generated by decoding one binary signal given through external signal lines. The wiring capacitance of the external signal lines is reduced, and the power dissipation is also reduced. Unnecessary pieces of the sense line are preferably inhibited from being precharged by a plurality of precharge switch circuits in order to further reduce the power dissipation.

It is preferable that the array control signals to be given to the partition switch circuits and the precharge switch circuits are held in latch circuits provided in each entry, thus achieving timesaving supply of the array control signals. Contents different in each entry can be held in the latch circuits. It is possible to use only one CAM section in an entry and two CAM sections in another entry. Consequently, it is suitable for a workstation in which page sizes differ with tasks.

PREFERRED EMBODIMENTS OF THE PRESENT INVENTION

Description is made below about three TLBs as semiconductor memory devices according to embodiments of the present invention, with reference to accompanying drawings.

FIRST EMBODIMENT

Figure 1:
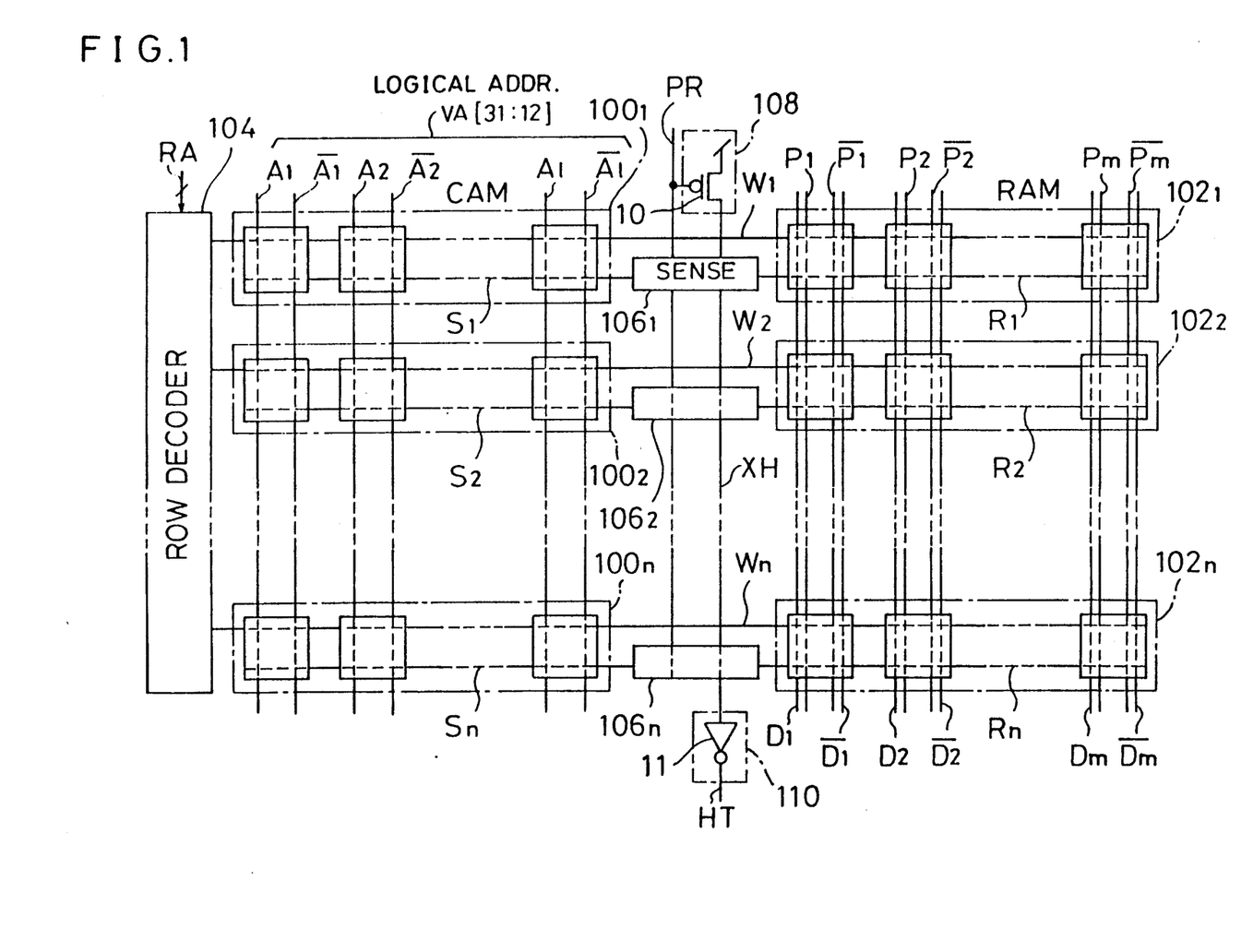
FIG. 1 is a block diagram showing a construction of a TLB according to a first embodiment of the present invention.

In a TLB in FIG. 1, reference numerals $100k$, $102k$ and $106k$ ($k=1-n$) indicate CAM cell arrays, dual-port RAM cell arrays and sense circuits, respectively. 104, 108 and 110 are a row decoder, a bit line precharge circuit, and an output buffer circuit respectively. Wk ($k=1-n$) indicate first word lines common to the CAM cell arrays $100k$ and the RAM cell arrays $102k$. Sk ($k=1-n$) indicate sense lines of the CAM cell arrays $100k$. Rk ($k=1-n$) indicate second word lines for the RAM cell arrays $102k$. XH is a hit signal line. RA is an address supplied for selecting one of the CAM cell arrays $100k$ and one of the RAM cell arrays $102k$ which compose a "k"th entry at writing thereinto. The hit line precharge circuit 108 is composed of a p-channel transistor 10 and the output buffer circuit 110 is composed of an inverter 11. PR is a precharge control signal and HT is a hit signal obtained by inverting a signal on the hit signal line XH. Ai and /Ai ($i=1-l$) are first bit lines for supplying logical addresses to the CAM cell arrays $100k$ for write-in and comparing operations. Wherein, upper 12 bits (VA[31:12]) of a 32-bit logical address (VA[31:0]) are given to all CAM cell arrays $100k$. Pj and /Pj ($j=1-m$) are second bit lines for supplying physical addresses (index part only) to be written into the RAM cell arrays $102k$. Dj and /Dj ($j=1-m$) are third bit lines for reading out the physical addresses from the RAM cell arrays $102k$.

Figure 2:
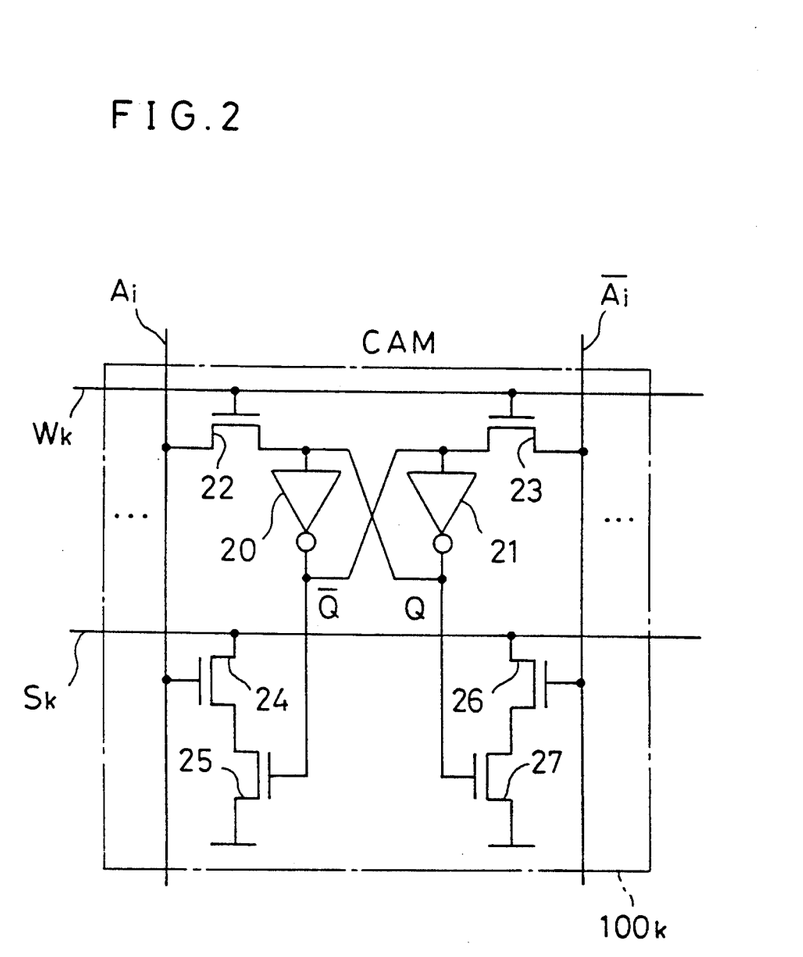
FIG. 2 is a circuit diagram of one CAM cell array in FIG. 1.

As shown in FIG. 2, a CAM cell in one of the CAM cell arrays $100k$ has two inverters 20, 21, which compose a flip-flop for memorizing data Q, /Q, and six n-channel transistors 22–27. The first word line Wk is connected in common to gates of the two n-channel transistors 22, 23 located on an input side of the flip-flop. When the first word line Wk is selected to be in 'H' (HIGH level), a logical address is written into the flip-flop through the first bit lines Ai, /Ai. The two n-channel transistors 24, 25 located on an output side of one inverter 20 are connected in series to each other and check whether Ai=/Q to output a result to the sense line Sk. The two n-channel transistors 26, 27 located on an output side of the other inverter 21 are also connected in series to each other and check whether Ai=Q to output a result to the sense line Sk. Consequently, Sk='Z' (high impedance state) when Ai=Q(/Ai=/Q), and Sk='L' (LOW level) when Ai=/Q(/Ai=Q).

Figure 3:
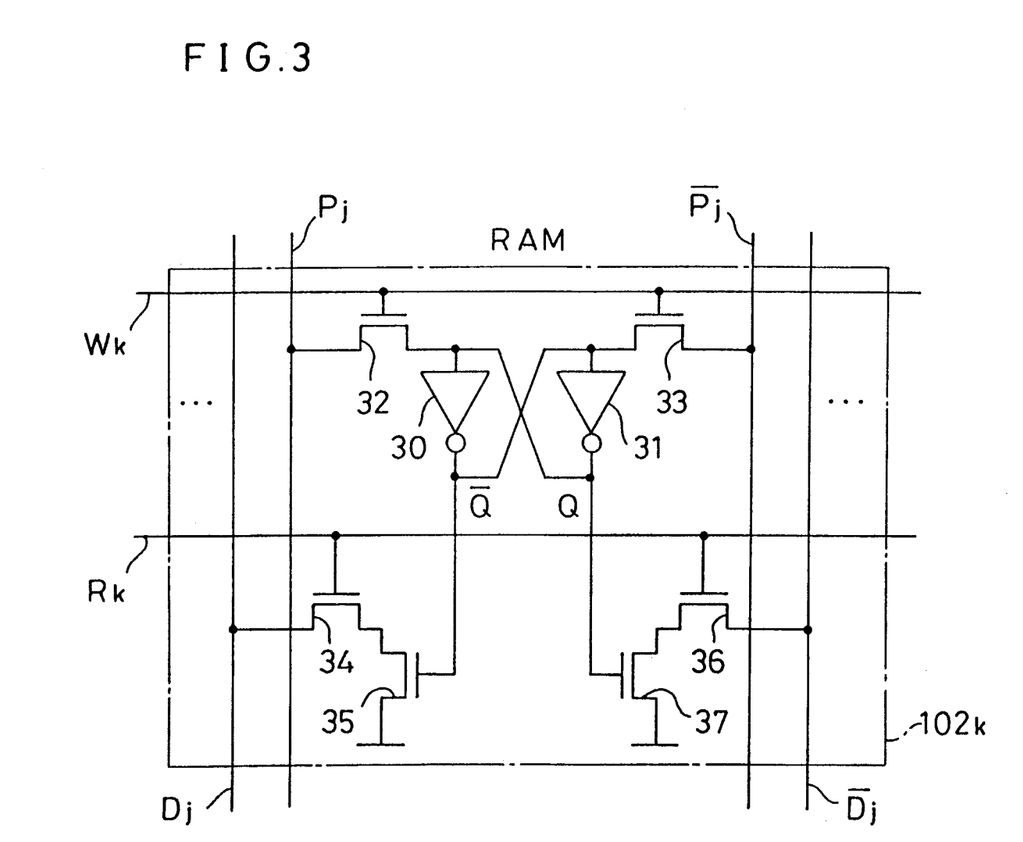
FIG. 3 is a circuit diagram of one RAM cell array in FIG. 1.

As shown in FIG. 3, a RAM cell in one of the RAM cell arrays $102k$ has two inverters 30, 31, which compose a flip-flop for memorizing data Q, /Q, and six n-channel transistors 32–37. The first word line Wk is connected in common to gates of the two n-channel transistors 32, 33 located on an input side of the flip-flop. When the first word line Wk is selected to be in 'H', a physical address given through the second bit lines Pj, /Pj is written into the flip-flop as the data Q, /Q. The two n-channel transistors 34, 35 located on an output side of one inverter 30 are connected in series to each other, and the two n-channel transistors 36, 37 located on an output side of the other inverter 31 are connected in series to each other. When the second word line Rk is selected to be in 'H', the physical address stored as the data Q, /Q is outputted onto the third bit lines Dj, /Dj.

Figure 4:
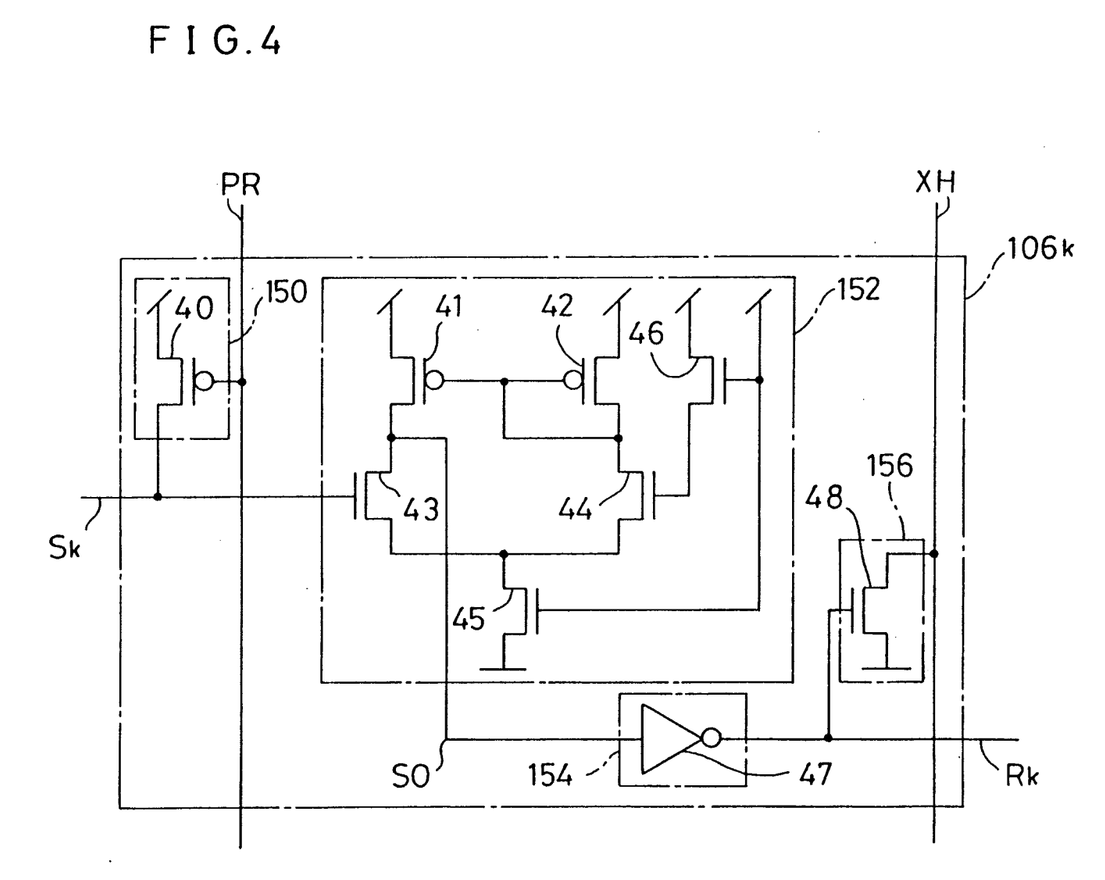
FIG. 4 is a circuit diagram of one sense circuit in FIG. 1.

As shown in FIG. 4, each sense circuit 106k is composed of a sense line precharge circuit 150, a sense amplifier 152, a buffer circuit 154, and a hit line discharge circuit 156. The sense line precharge circuit 150 is composed of a p-channel transistor 40 in which the precharge control signal PR is given to a gate and the sense line Sk is connected to a drain thereof. The sense amplifier 152 is a current-mirror type differential amplifier composed of two p-channel transistors 40, 41 and four n-channel transistors 43–46. The sense amplifier 152 receives a signal on the sense line Sk as one input and a fixed voltage signal specified by the n-channel transistor 46 as the other input, respectively, and outputs an amplified signal SO according to the potential of the sense line Sk. The amplified signal SO is inputted to the buffer circuit 154 composed of an inverter 47 having sufficient driving ability, and outputted onto the second word line Rk after inverted. The hit line discharge circuit 156 is composed of an n-channel transistor 48 in which the second word line Rk is connected to a gate and the hit signal line XH is connected to a drain thereof.

The operations are described of the TLB with the above construction according to the first embodiment.

First, a write-in operation in the "k"th entry is described. A logical address is given to the CAM cell array 100k through the first bit lines Ai, /Ai and a physical address is given to the RAM cell array 102k through the second bit lines Pj, /Pj. The address RA for selecting the "k"th entry is inputted to the row decoder 104. As a result, the first word line Wk for the "k"th entry is set in 'H' from 'L', and the given logical address and the given physical address are respectively stored in the CAM cell array 100k and RAM cell array 102k.

Next described is comparing operation. During a period of 'L' of the precharge control signal PR, the hit signal line XH and all of the sense lines Sk (k=1−n) are held in 'H' by the operation of the hit line precharge circuit 108 (in FIG. 1) and the sense line precharge circuits 150 in the sense circuits 106k (FIG. 4). After the precharge is stopped by making the precharge control signal PR 'H', the comparing operation in each CAM cell array 100k begins.

Each CAM cell array 100k compares, bit by bit, a prestored logical address with a logical address inputted through the first bit lines Ai, /Ai. When conformity in all bits is detected, the precharged sense line Sk is held in 'H' without being brought down into 'L'. As a result, SO='L', Rk='H' and XH='L' in the sense circuit 106k shown in FIG. 4. In this way, when the second word line Rk of the "k"th entry is selected to be in 'H', the physical address stored in the RAM cell array 102k of the "k"th entry is read out through the third bit lines Dj, /Dj. Concurrently therewith, the output buffer circuit 110 receives a 'L' signal on the hit signal line XH, and outputs a hit signal HT of 'H' so as to indicate the conformity.

When any difference is detected in the comparison by the CAM cell array 100k, the sense line Sk for the "k"th entry is set in 'L'. As a result, SO='H', Rk='L' and XH='Z' in the sense circuit 106k. If all the sense lines Sk (k=1−n) are in 'L', no physical address is read out from RAM cell arrays 102k. The precharged hit signal line XH is held in "H" without being brought down into 'L', thus the hit signal HT is in 'L' which indicates a miss.

As described above, according to the TLB in this embodiment, the hit signal HT according to hit or miss in the CAM cell arrays 100k can be obtained, as well as the logical addresses can be translated into the physical addresses. The first word lines Wk for writing information into the RAM cell arrays 102k and the second word lines Rk for read-out therefrom are separated from each other, the first word lines Wk are used in common with the word lines for writing information into the CAM cell arrays 100k, and the second word lines Rk are asserted by the sense circuits 106k solely based on the sense lines Sk. Thus the sense circuits 106k are simplified in their constructions and the speed of the comparing operation is enhanced. Since the second bit lines Pj, /Pj for write-in and the third bit lines Dj, /Dj for read-out are separated from each other, an unexpected write into the RAM cell arrays 102k is prevented without failure.

Second Embodiment

Figure 5:
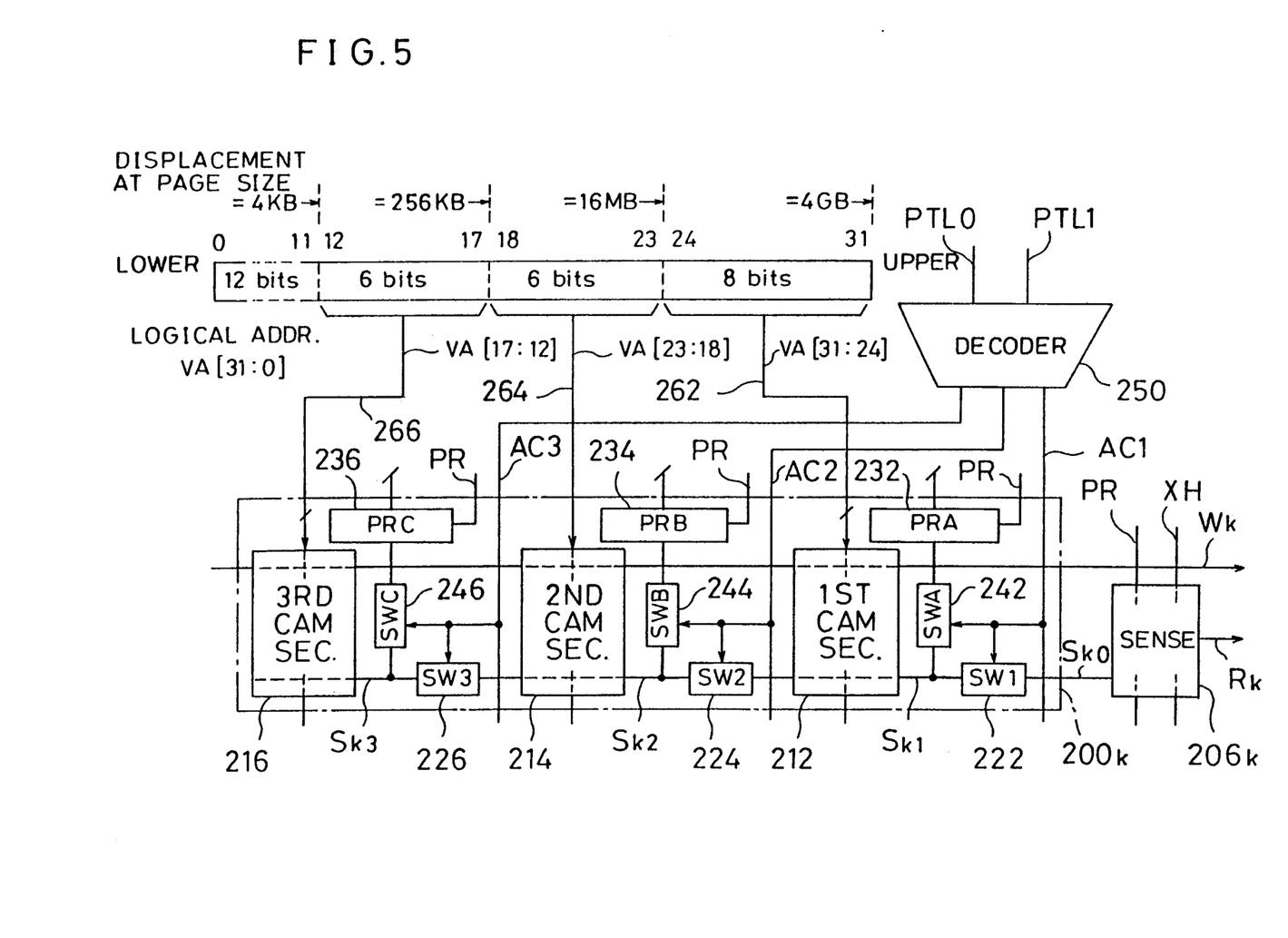
FIG. 5 is a block diagram showing an inside construction of one CAM cell array in a TLB according to a second embodiment of the present invention, with a construction of the vicinity thereof.

A TLB shown in FIG. 5 includes CAM cell arrays 200k, sense circuits 206k, and a decoder 250. The row decoder, the RAM cell arrays, the hit line precharge circuits and the output buffer circuit (see FIG. 1) are not drawn in FIG. 5 for avoiding complexity.

In FIG. 5, a sense line for one of the CAM cell arrays 200k connected at one end thereof to the sense circuit 206k is divided into zeroth to third pieces Sk0, Sk1, Sk2, Sk3 by first, second and third partition switch circuits (SW1, SW2, SW3) 222, 224, 226 arranged on the sense line. The connecting part to the sense circuit 206k is the zeroth piece of sense line Sk0.

On the other hand, one CAM cell array 200k having 20 CAM cells is divided into first, second and third CAM sections 212, 214, 216. The first CAM section 212 includes eight CAM cells which share the first piece of sense line Sk1. The second CAM section 214 includes six CAM cells which share the second piece of sense line Sk2. The third CAM section 216 includes the remaining six CAM cells which share the third piece of sense line Sk3. The CAM cells in all CAM sections 212, 214, 216 share the first word line Wk.

In case of 4 KB page size, a 20-bit index (VA[31:12]) is required to be dealt with so that lower 12 bits of the 32-bit logical address (VA[31:0]) are to be a displacement. In case of 256 KB page size, a 14-bit index (VA[31:18]) is dealt with so that lower 18 bits are regarded as the displacement. In case of 16 MB page size, an 8-bit index (VA[31:24]) is handled so that lower 24 bits are regarded as the displacement. In case of 4 GB page size, all bits of the 32-bit logical address (VA[31:0]) are regarded as the displacement. The index (VA[31:12]) at the minimum page size (4 KB) of the four page size types is divided into first, second and third partial indexes (VA[31:24], VA[23:18], VA[17:12]) 262, 264, 266. First to third partial indexes 262, 264, 266 are respectively inputted to first to third CAM sections 212, 214, 216.

First to third precharge circuits (PRA, PRB, PRC) 232, 234, 236 are circuits for individually precharging the first to third pieces of sense line Sk1, Sk2, Sk3 via respective first to third precharge switch circuits (SWA, SWB, SWC) 242, 244, 246, and has the same inside construction as the sense line precharge circuit 150 in FIG. 4. First to third partition switch circuits 222, 224, 226 and first to third precharge switch circuits 242, 244, 246 are respectively controlled to be opened and closed by first, second and third array control signals AC1, AC2, AC3 supplied from the decoder 250.

The decoder 250 is a circuit for decoding a page table level signal PTL as one binary signal given through two external signal lines to first to third array control signals AC1, AC2, AC3. The page table level signal PTL is composed of two bits of a lower bit (zeroth bit) PTL0 and an upper bit (first bit) PTL1. A corresponding relation between the page table level signal of PTL1 and PTL0 and first to third array control signals AC1, AC2, AC3 are shown in Table 1.

TABLE 1

| page size | page table level | page table level signal PTL1 | PTL0 | array control signals AC1 | AC2 | AC3 |
|---|---|---|---|---|---|---|
| 4 KB | 3 | H | H | H | H | H |
| 256 KB | 2 | H | L | H | H | L |
| 16 MB | 1 | L | H | H | L | L |
| 4 GB | 0 | L | L | L | L | L |

Figure 6:
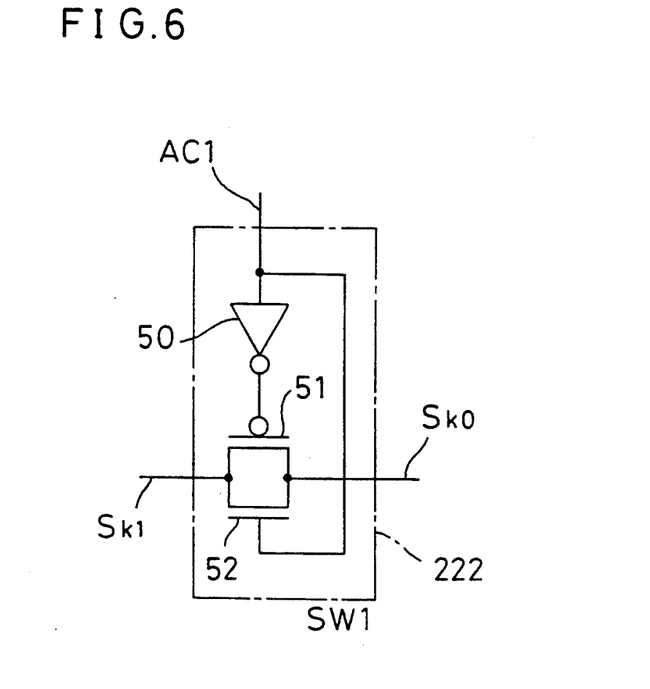
FIG. 6 is a circuit diagram of a first partition switch circuit in FIG. 5.

As shown in FIG. 6, inside the first partition switch circuit (SW1) 222, a source of the p-channel transistor 51 and that of the n-channel transistor 52 are connected to each other and drains thereof are also connected to each other. The first array control signal AC1 is inputted to the gate of the p-channel transistor 51 after inverted by the inverter 50, and inputted directly to the gate of the n-channel transistor 52. In this way, both transistors 51, 52 are in ON state when the first array control signal AC1 is 'H', and both transistors 51, 52 are in OFF state when the first array control signal is 'L'. Wherein, each inside construction of second and third partition switch circuits (SW2, SW3) 224, 226 is the same as in FIG. 6.

Figure 7:
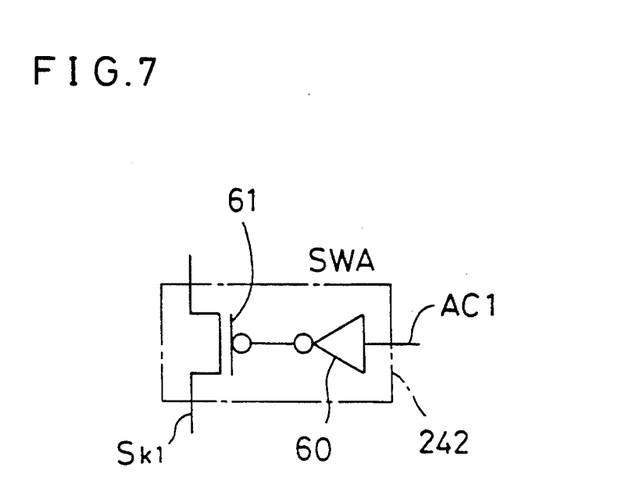
FIG. 7 is a circuit diagram of a first precharge switch circuit in FIG. 5.

As shown in FIG. 7, inside the first precharge switch circuit (SWA) 242, the first array control signal AC1 is inputted to the gate of the p-channel transistor 61 after inverted by the inverter 60. In this way, the p-channel transistor 61 is in ON state when the first array control signal AC1 is 'H', and the p-channel transistor 61 is in OFF state when the first array control signal is 'L'. Wherein each inside construction of second and third precharge switch circuits (SWB, SWC) 244, 246 is the same as in FIG. 7.

Figure 8:
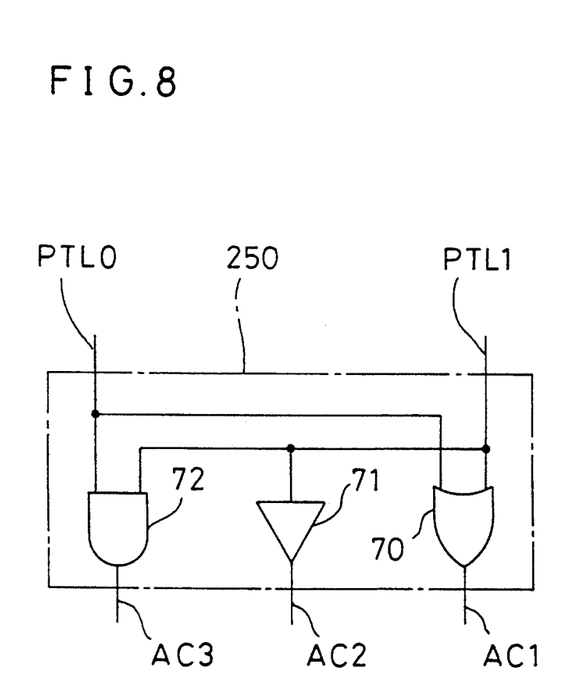
FIG. 8 is a circuit diagram of a decoder in FIG. 5.

In the decoder 250 shown in FIG. 8, reference numeral 70 designates a 2-input OR gate for outputting the first array control signal AC1. 71 is a buffer for outputting the second array control signal AC2. 72 is a 2-input AND gate for outputting the third array control signal AC3. The zeroth bit PTL0 of the page table level signal is connected in common to one input terminal of the 2-input OR gate 70 and one input terminal of the 2-input AND gate 72. The first bit PTL1 of the page table level signal is connected in common to the other input terminal of the 2-input OR gate 70, an input terminal of the buffer 71 and the other input terminal of the 2-input AND gate 72.

The operation of the TLB with the above construction according to the second embodiment is described in each case of the respective page sizes. Wherein, only the comparing operation in the CAM cell array 200k is described, since the write-in operation is the same as in the first embodiment.

In case of 4 KB page size, all bits (VA[31:12]) of first to third partial indexes 262, 264, 266 and the respectively corresponding bits stored in the CAM cells in each CAM section 212, 214, 216 are compared with each other. Therefore, PTL1 and PTL0 of the page table level signal are respectively 'H' (level 3) and first to third array control signals AC1, AC2, AC3 are respectively 'H', so that first to third partition switch circuits 222, 224, 226 and first to third precharge switch circuits 242, 244, 246 are all closed. As a result, the first to third pieces of sense line Sk1, Sk2, Sk3 are all connected to the zeroth piece of sense line Sk0 and are capable of being precharged.

Then, by making the precharge control signal PR 'L' during a set period, first to third precharge circuits 232, 234, 236 in the CAM cell array 200k and the sense line precharge circuit in the sense circuit 206k are operated to make the zeroth to third pieces of sense line Sk0, Sk1, Sk2, Sk3 'H'. Thereafter, after the precharge control signal PR is made to 'H' to stop precharging, the comparing operation by all CAM sections 212, 214, 216 in the CAM cell array 200k begins. When conformity in all bits is detected, the precharged pieces of sense line Sk0, Sk1, Sk2, Sk3 are all in 'H' without being discharged. As a result, Rk='H' and XH='L' in the sense circuit 206k. When any difference is detected in the comparison, zeroth to third pieces of sense line Sk0, Sk1, Sk2, Sk3 are discharged to be all in 'L', so that Rk='L' and XH='Z'.

In case of 256 KB page size, the comparison by the third CAM section 216 regarding the third partial index (VA[17:12]) 266 is unnecessary. Accordingly, PTL1 and PTL0 of the page table level signal are respectively 'H' and 'L' (level 2), and first to third array control signals AC1, AC2, AC3 are respectively 'H', 'H' and 'L', so that only the third partition switch circuit 226 and the third precharge switch circuit 246 out of all switch circuits are opened. As a result, first and second pieces of sense line Sk1, Sk2 are connected to the zeroth piece of sense line Sk0 and are capable of being precharged, but the third piece of sense line Sk3 is cut off from the other pieces of sense line Sk0, Sk1, Sk2 and is inhibited from being precharged. Thus the sense line is shortened, and only first and second CAM sections 212, 214 are used.

In case of 16 MB page size, the comparison by second and third CAM sections 214, 216 regarding second and third partial indexes (VA[23:12]) 264, 266 are unnecessary. Therefore, PTL1 and PTL0 of the page table level signal are respectively 'L' and 'H' (level 1) and first to third array control signals AC1, AC2, AC3 are respectively 'H', 'L' and 'L', so that only the first partition switch circuit 222 and the first precharge switch circuit 242 out of all switch circuits are closed. As a result, the first piece of sense line Sk1 is connected to the zeroth piece of sense line Sk0 and is capable of being precharged, but the second and third pieces of sense line Sk2, Sk3 are cut off from the zeroth and first pieces of sense line Sk0, Sk1 and is inhibited from being precharged. In this way, the sense line is shortened, and the only first CAM section 212 is used.

In case of 4 GB page size, the comparison by all CAM sections 212, 214, 216 are unnecessary. Therefore, PTL1 and PTL0 of the page table level signal are respectively 'L' and first to third array control signals AC1, AC2, AC3 are respectively 'L', so that first to third partition switch circuits 222, 224, 226 and first to third precharge switch circuits 242, 244, 246 are all opened. As a result, the first to third pieces of sense line Sk1, Sk2, Sk3 are all cut off from the zeroth piece of sense line Sk0 and are inhibited from being precharged. Thus the operation of the CAM cell array 200k is stopped.

According to this embodiment, as described above, optimum length of the sense line is utilized according to the page size by connecting/disconnecting the pieces of sense line Sk1, Sk2, Sk3 to/from the sense circuit 206k by means of the partition switch circuits 222, 224, 226. Thus the high-speed comparing operation and, in its turn, the high-speed address translation are achieved. Further, since the pieces of sense line for unnecessary CAM sections at the comparing operation are not precharged, power dissipation is reduced. In addition, with the decoder 250, the number of the external signal lines and the wiring capacitance thereof are reduced, which leads to further reduction of the power dissipation.

In this embodiment the number N of the CAM sections is 3, however, the number N can be changed. The number of bits of the page table level signal PTL to be inputted to the decoder 250 is changed according to the number N of the CAM sections. Also, in this embodiment, the bit numbers of first to third partial indexes 262, 264, 266 are respectively 8, 6 and 6. However, it is not limited to this case. It is possible to give first to third array control signals, AC1, AC2, AC3 to first to third partition switch circuits 222, 224, 226 and first to third precharge switch circuits 242, 244, 246 directly from the outside. When first to third precharge switch circuits 242, 244, 246 are dispensed with, first to third pieces of sense line Sk1, Sk2, Sk3 are always capable of being precharged.

Third Embodiment

Figure 9:
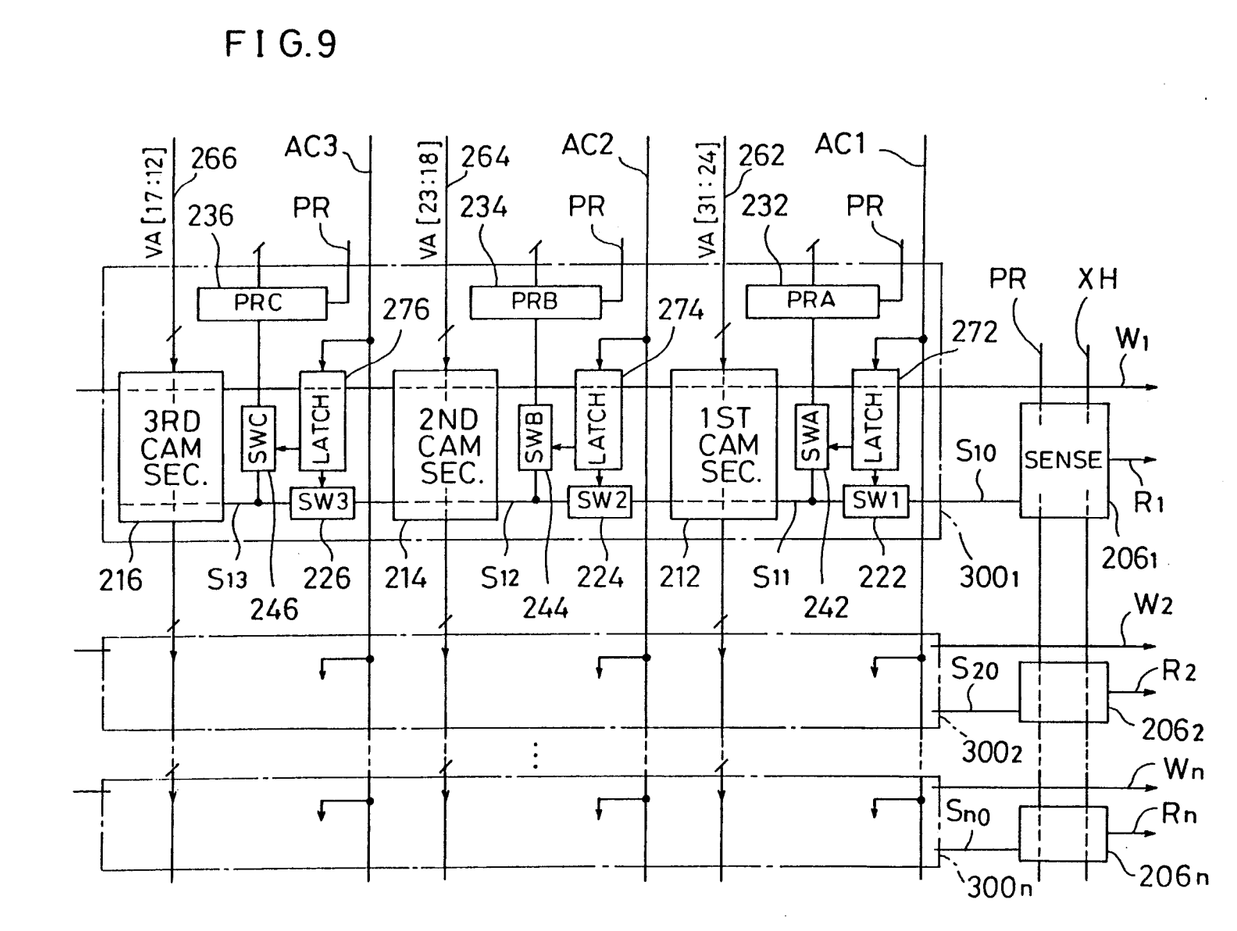
FIG. 9 is a block diagram showing each inside construction of CAM cell arrays in a TLB according to a third embodiment of the present invention.

A TLB shown in FIG. 9 includes CAM cell arrays 300k and sense circuits 206k. The row decoder, the RAM cell arrays, the hit line precharge circuit and the output buffer circuit (see FIG. 1) and the decoder (see FIG. 5) are not drawn in FIG. 9 for avoiding complexity.

In FIG. 9, each CAM cell array 300k has first, second and third latch circuits 272, 274, 276. Each latch circuit 272, 274, 276 is a circuit for holding respective first to third array control signals AC1, AC2, AC3 to be given to first to third partition switch circuits 222, 224, 226 and first to third precharge switch circuits 242, 244, 246. First to third array control signals AC1, AC2, AC3 are given in common to first to third latch circuits 272, 274, 276 of all entries. The detailed description of the other aspects are omitted since they are the same in the second embodiment.

Figure 10:
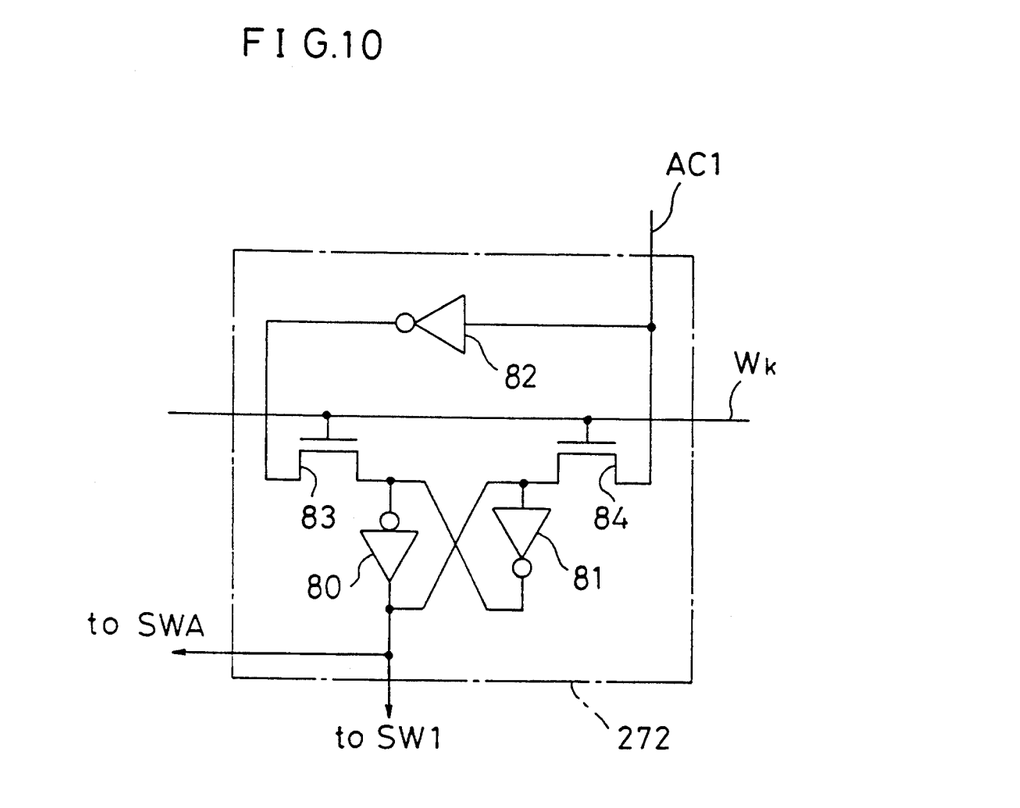
FIG. 10 is a circuit diagram of a first latch circuit in FIG. 9.

As shown in FIG. 10, the first latch circuit 272 in the CAM cell array 300k of one entry is composed of three inverters 80, 81, 82 and two n-channel transistors 83, 84. The two inverters 80, 81 compose a flip-flop for memorizing the first array control signal AC1. The first word line Wk is connected in common to the gates of the two n-channel transistors 83, 84 located on an input side of the flip-flop. The first array control signal AC1 is written into the flip-flop when the first word line Wk is selected to be in 'H'. The written content is held even when the first word line Wk is in 'L'. Wherein, the inside construction of second and third latch circuits 274, 276 in the CAM cell array 300k is the same as in FIG. 10, and the same as in the other entries.

In case, for example, where the address translation of 256 KB page size and that of 16 MB page size are required for respective first and second tasks in a workstation, 'H', 'H' and 'L' are held in first to third latch circuits 272, 274, 276 for the 256 KB page size in the 'j'th entry CAM cell array 300j, and 'H', 'L' and 'L' are held in first to third latch circuits 272, 274, 276 for the 16 MB page size in the "k"th entry CAM cell array 300k. As a result, only first and second CAM sections 212, 214 are used in the "j"th entry, and only the first CAM section 212 is used in the "k"th entry.

According to this embodiment, first to third array control signals AC1, AC2, AC3 are respectively held in first to third latch circuits 272, 274, 276, thus it is unnecessary to repeatedly give the same array control signals AC1, AC2, AC3. Further, since the array control signals being held can differ with entries, optimum length of the sense line is individually utilized in each entry according to the page size.

Naturally, when first to third precharge switch circuits 242, 244, 246 are dispensed with, first to third latch circuits 272, 274, 276 hold first to third array control signals AC1, AC2, AC3 respectively only for first to third partition switch circuits 222, 224, 226.

Described above is about the three TLBs as semiconductor memory devices according to the embodiments of the present invention. However, this invention is applicable to other kinds of semiconductor memory device such as a cache memory provided with CAM cell arrays (tag part) and RAM cell arrays (data part), and the like.

We claim:

1. A semiconductor memory device comprising:
    a plurality of first memory cell arrays which share first bit lines with each other, each of said plural first memory cell arrays having a first word line and a sense line, and having functions of storing information on said first bit lines at assertion of said first word line and of asserting said sense line when the stored information conforms to other information on said first bit lines;
    a plurality of second memory cell arrays which share second bit lines and third bit lines with each other, said second and third bit lines being separated from each other, each of said plural second memory cell arrays sharing said first word line with one of said plural first memory cell arrays so as to compose one entry, each of said plural second memory cell arrays having a second word line and having functions of storing information on said second bit lines at assertion of said first word line and of outputting the stored information onto said third bit lines at assertion of said second word line;
    a plurality of sense circuits intervening between said plural first memory cell arrays and said plural second memory cell arrays, each of said plural sense circuits having a function of asserting said second word line of one of said plural second memory cell arrays at assertion of said sense line of corresponding one of said plural first memory cell arrays in the same entry; and
    an entry selecting circuit for asserting one of said first word lines.

2. The semiconductor memory device according to claim 1, wherein:
    each of said plural first memory cell arrays is composed as an associative memory cell array having a plurality of memory cells and includes:

first to "N"th associative memory sections into which said associative memory cell array is divided, where N≧2;

first to "N"th partition switch circuits which are arranged on said sense line for said associative memory cell array so as to divide said sense line into zeroth to "N"th pieces, which allow said first to "N"th associative memory sections individually to discharge said first to "N"th pieces of sense line, and respective switching operations of which are controlled by first to "N"th array control signals; and first to "N"th precharge circuits for precharging said first to "N"th pieces of sense line respectively, and each of said plural sense circuits has functions of precharging said zeroth piece of sense line and of asserting said second word line by amplifying a potential of said zeroth to "M"th pieces of sense line, where 0≦M≦N, according to a switching pattern of said first to "N"th partition switch circuits.

3. A semiconductor memory device comprising:

first to "N"th associative memory sections into which one associative memory cell array having a plurality of memory cells is divided, where N≧2;

first to "N"th partition switch circuits which are arranged on one sense line for said associative memory cell array so as to divide said sense line into zeroth to "N"th pieces, which allow said first to "N"th associative memory sections individually to discharge said first to "N"th pieces of sense line, and respective switching operations of which are controlled by first to "N"th array control signals;

first to "N"th precharge circuits for precharging said first to "N"th pieces of sense line respectively; and a sense circuit for precharging said zeroth piece of sense line and for amplifying a potential of said zeroth to "M"th pieces of sense line, where 0≦M≦N, according to a switching pattern of said first to "N"th partition switch circuits.

4. The semiconductor memory device according to claim 3, further comprising a decode circuit for decoding one binary signal to said first to "N"th array control signals.

5. The semiconductor memory device according to claim 3, further comprising first to "N"th latch circuits for holding said first to "N"th array control signals to be given to said first to "N"th partition switch circuits respectively.

6. The semiconductor memory device according to claim 3, further comprising first to "N"th precharge switch circuits intervening between said first to "N"th pieces of sense line and said first to "N"th precharge circuits respectively, respective switching operations of said first to "N"th precharge switch circuits being controlled by said first to "N"th array control signals.

7. The semiconductor memory device according to claim 6, further comprising first to "N"th latch circuits for holding said first to "N"th array control signals to be given to said first to "N"th precharge switch circuits respectively.

8. The semiconductor memory device for an address translation of variable page size according to claim 3, wherein a total memory cell number of said first to "N"th associative memory sections is equal to a bit number of a longest index in a logical address, and first to "N"th partial indexes into which said longest index is divided are given to said first to "N"th associative memory sections respectively as information for comparison.

* * * * *

UNITED STATES PATENT AND TRADEMARK OFFICE
CERTIFICATE OF CORRECTION

PATENT NO. : 5,327,372
DATED     : July 5, 1994
INVENTOR(S) : Akihisa Oka et al.

It is certified that error appears in the above-identified patent and that said Letters Patent is hereby corrected as shown below:

Column 1, Line 30:  "tranlation" should read --translation--.

Column 1, Line 37:  "high-spaced" should read --high-speed--.

Column 1, Line 67:  "a" should be deleted.

Column 2, Line 4:   "a" should be deleted.

Column 2, Line 6:   "V[23:0])" should read --VA[23:0])--.

Column 2, Line 7:   "(VA[31:01])" should read --(VA[31:0])--.

Column 2, Line 11:  "a" should be deleted.

Column 3, Line 8:   "high-spaced" should read --high-speed--.

Column 4, Line 18:  "bit" should read --hit--.

Signed and Sealed this

Twenty-third Day of May, 1995

Attest:

BRUCE LEHMAN

*Attesting Officer*     *Commissioner of Patents and Trademarks*